(12) United States Patent
Huang et al.

(10) Patent No.: US 11,152,891 B1
(45) Date of Patent: Oct. 19, 2021

(54) INDUCTOR-CAPACITOR OSCILLATOR WITH EMBEDDED SECOND HARMONIC FILTER AND ASSOCIATED DUAL CORE OSCILLATOR

(71) Applicant: MEDIATEK INC., Hsin-Chu (TW)

(72) Inventors: Hao-Wei Huang, Hsinchu (TW); Ang-Sheng Lin, Hsinchu (TW); Wei-Hao Chiu, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 17/114,410

(22) Filed: Dec. 7, 2020

Related U.S. Application Data

(60) Provisional application No. 63/006,810, filed on Apr. 8, 2020.

(51) Int. Cl.
*H03B 5/12* (2006.01)
*H03B 1/04* (2006.01)

(52) U.S. Cl.
CPC ............ *H03B 5/1228* (2013.01); *H03B 1/04* (2013.01); *H03B 2200/007* (2013.01); *H03B 2200/009* (2013.01)

(58) Field of Classification Search
CPC .. H03B 5/1228; H03B 1/04; H03B 2200/009; H03B 2200/007; H03B 5/1268; H03B 5/1215
USPC ............................................. 331/167, 117 FE
See application file for complete search history.

(56) References Cited

U.S. PATENT DOCUMENTS

| | | | |
|---|---|---|---|
| 7,847,650 B2 * | 12/2010 | Yao | H03B 5/1215 331/167 |
| 9,008,601 B2 | 4/2015 | Murphy | |
| 9,742,352 B2 | 8/2017 | Lin | |
| 9,742,353 B2 | 8/2017 | Murphy | |
| 2011/0109396 A1 * | 5/2011 | Tanabe | H03B 5/1268 331/117 FE |
| 2013/0063219 A1 | 3/2013 | Shanan | |

OTHER PUBLICATIONS

Emad Hegazi, Henrik Sjöland, Asad A. Abidi, "A Filtering Technique to Lower LC Oscillator Phase Noise", JSSC, p. 1921-p. 1930, IEEE, USA. ,Dec. 2001.

(Continued)

*Primary Examiner* — Arnold M Kinkead
(74) *Attorney, Agent, or Firm* — Winston Hsu

(57) ABSTRACT

An inductor-capacitor (LC) oscillator with an embedded second harmonic filter and an associated dual core oscillator are provided. The LC oscillator includes a first transistor, a second transistor, a first part-one inductor, a second part-one inductor, a part-one capacitor, a part-two inductor and at least one part-two capacitor. A first end of the first part-one inductor and a first end of the second part-one inductor are coupled to gate terminals of the second transistor and the first transistor, respectively. The part-one capacitor is coupled between the first end of the first part-one inductor and the first end of the second part-one inductor. The part-two inductor is coupled between a second end of the first part-one inductor and a second end of the second part-one inductor. The at least one part-two capacitor is coupled to drain terminals of the first transistor and the second transistor.

19 Claims, 9 Drawing Sheets

(56) References Cited

OTHER PUBLICATIONS

Chee-Cheow Lim, Jun Yin, Pui-In Mak, Harikrishnan Ramiah, Rui P. Martins, "An Inverse-Class-F CMOS VCO with Intrinsic-High-Q 1st- and 2nd-Harmonic Resonances for 1/f2-to-1/f3 Phase-Noise Suppression Achieving 196.2dBc/Hz FOM", ISSCC, 2018, IEEE, USA. ,2018.

Danilo Manstretta et al., An intuitive Analysis of Phase Noise Fundamental Limits in LC Oscillators, 2015 International Conference on Noise and Fluctuations (ICNF), 2015 IEEE, pp. 1-6, XP033224200, 2015.

* cited by examiner

INDUCTOR-CAPACITOR OSCILLATOR WITH EMBEDDED SECOND HARMONIC FILTER AND ASSOCIATED DUAL CORE OSCILLATOR

CROSS REFERENCE TO RELATED APPLICATIONS

This application claims the benefit of U.S. provisional application No. 63/006,810, which was filed on Apr. 8, 2020, and is included herein by reference.

BACKGROUND

The present invention is related to inductor-capacitor (LC) oscillator, and more particularly, to an LC oscillator with an embedded second harmonic filter and an associated dual core oscillator.

In general, an oscillator not only generates a fundamental frequency which is determined by a main resonant tank, but also generates unwanted second harmonic frequency which may cause noise up-conversion. An extra tank may be adapted to filter the second harmonic frequency in order to block or weaken the second harmonic frequency in related arts. Some disadvantages still exist in this architecture, however. For example, the main resonant tank and the extra tank may be independent and apart from each other, and process variation of components such as inductors and capacitors within the main resonant tank and the extra tank may degrade the performance of second harmonic filtering since their variations are typically also independent. Furthermore, the extra tank is usually designed to have low-quality factor (low-Q) because of the area limitation, and therefore has poor noise-related performance.

Thus, there is a need for a novel architecture of an LC oscillator, which has less sensitivity regarding the process variation and better noise-related performance (e.g. less phase noise) in comparison with the related arts.

SUMMARY

An objective of the present invention is to provide an inductor-capacitor (LC) oscillator with an embedded second harmonic filter and an associated dual core oscillator, which have less sensitivity regarding the process variation and better noise-related performance (e.g. less phase noise) in comparison with the related arts.

At least one embodiment of the present invention provides an LC oscillator with an embedded second harmonic filter. The LC oscillator may comprise a first transistor, a second transistor, a first part-one inductor, a second part-one inductor, a part-one capacitor, a part-two inductor and at least one part-two capacitor. A first end of the first part-one inductor and a first end of the second part-one inductor are coupled to gate terminals of the second transistor and the first transistor, respectively. The part-one capacitor is coupled between the first end of the first part-one inductor and the first end of the second part-one inductor. The part-two inductor is coupled between a second end of the first part-one inductor and a second end of the second part-one inductor. The at least one part-two capacitor is coupled to drain terminals of the first transistor and the second transistor.

At least one embodiment of the present invention provides a dual core oscillator, wherein the dual core oscillator may comprise a first LC oscillator and a second LC oscillator identical to each other. Each of the first LC oscillator and the second LC oscillator may comprise a first transistor, a second transistor, a first part-one inductor, a second part-one inductor, a part-one capacitor, a part-two inductor and at least one part-two capacitor. A first end of the first part-one inductor and a first end of the second part-one inductor are coupled to gate terminals of the second transistor and the first transistor, respectively. The part-one capacitor is coupled between the first end of the first part-one inductor and the first end of the second part-one inductor. The part-two inductor is coupled between a second end of the first part-one inductor and a second end of the second part-one inductor. The at least one part-two capacitor is coupled to drain terminals of the first transistor and the second transistor. More particularly, the part-two inductor of the first LC oscillator is coupled to the part-two inductor of the second LC oscillator.

At least one embodiment of the present invention provides a dual core oscillator. The dual core oscillator may comprise an LC oscillator, wherein the LC oscillator may comprise a first transistor, a second transistor and a first LC tank. The first LC tank may comprise a first part-one inductor, a second part-one inductor, a part-one capacitor, a part-two inductor and at least one part-two capacitor. A first end of the first part-one inductor and a first end of the second part-one inductor are coupled to gate terminals of the second transistor and the first transistor, respectively. The part-one capacitor is coupled between the first end of the first part-one inductor and the first end of the second part-one inductor. The part-two inductor, coupled between a second end of the first part-one inductor and a second end of the second part-one inductor. The at least one part-two capacitor, coupled to drain terminals of the first transistor and the second transistor. The dual core oscillator may further comprise a second LC tank, which comprises at least one inductor and at least one capacitor. More particularly, the part-two inductor of the first LC oscillator is coupled to the at least one inductor of the second LC tank.

The LC oscillator provided by embodiments of the present invention has an LC tank with an embedded second harmonic filter therein. All components (e.g. inductors and capacitors) within the LC tank can be laid out together, which greatly reduce sensitivity to the process variation in comparison with using a standalone second harmonic filter tank. In addition, embodiments of the present invention will not greatly increase overall costs. Thus, the present invention can solve the problem of the related art without introducing any side effect or in a way that is less likely to introduce side effects.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1A:
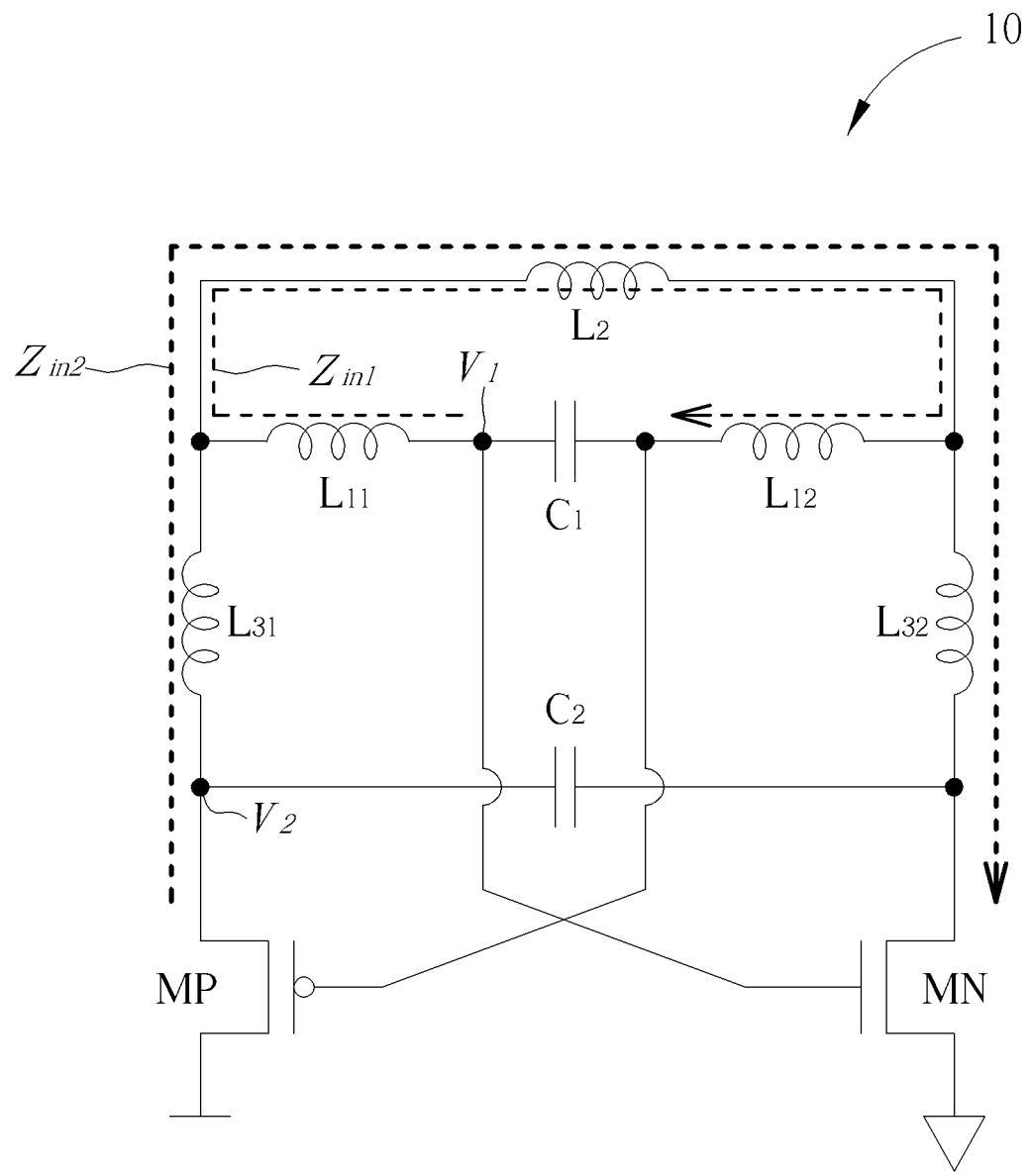
FIG. 1A is a diagram illustrating an LC oscillator with an embedded second harmonic filter according to an embodiment of the present invention.

FIG. 1A is a diagram illustrating an inductor-capacitor (LC) oscillator 10 with an embedded second harmonic filter according to an embodiment of the present invention. As shown in FIG. 1A, the LC oscillator 10 may comprise a first transistor such as a P-type transistor MP (e.g. P-type Metal-Oxide-Semiconductor Field-Effect Transistor (MOSFET)), a second transistor such as an N-type transistor MN (e.g. N-type MOSFET), a first part-one inductor such as an inductor $L_{11}$, a second part-one inductor such as an inductor $L_{12}$, a part-one capacitor such as a capacitor $C_1$, a part-two inductor such as an inductor $L_2$, and at least one part-two capacitor such as a capacitor $C_2$. A first end of the inductor $L_{11}$ and a first end of the inductor $L_{12}$ are coupled to gate terminals of the N-type transistor MN and the P-type transistor MP, respectively. The capacitor $C_1$ is coupled between the first end of the inductor $L_{11}$ and the first end of the inductor $L_{12}$. The inductor $L_2$ is coupled between a second end of the inductor $L_{11}$ and a second end of the inductor $L_{12}$. The at least one part-two capacitor is coupled to drain terminals of the first transistor and the second transistor. For example, the capacitor C2 is coupled between the drain terminals of the P-type transistor MP and the N-type transistor MN. Source terminals of the P-type transistor MP and the N-type transistor MN are coupled to a supply voltage terminal (e.g. a terminal providing the highest fixed voltage level within the LC oscillator 10) and a ground voltage terminal (e.g. a terminal providing the lowest fixed voltage level within the LC oscillator 10), respectively.

As shown in FIG. 1A, the LC oscillator 10 may further comprise a first part-three inductor such as an inductor $L_{31}$ and a second part-three inductor such as an inductor $L_{32}$, where the inductor $L_{31}$ is coupled between the second end of the inductor $L_{11}$ and the drain terminal of the P-type transistor MP, and the inductor $L_{32}$ is coupled between the second end of the inductor $L_{12}$ and the drain terminal of the N-type transistor MN.

For better illustration, inductance and capacitance of corresponding components are indicated by italic of the same/similar symbols of the corresponding components. For example, capacitance of the capacitor $C_1$ and capacitance of the capacitor $C_2$ are represented by $C_1$ and $C_2$, respectively, inductance of each of the inductors $L_{11}$ and $L_{12}$ is represented by $L_1$, inductance of the inductor L2 is represented by L2, inductance of each of the inductors $L_{31}$ and $L_{32}$ is represented by $L_3$, where a symbol "s" may represent a variable associated with frequency and phase. As for the architecture which has the inductors $L_{31}$ and $L_{32}$ shown in FIG. 1A, at least the inductors $L_{11}$ and $L_{12}$, the inductor $L_2$ and the capacitor $C_1$ constitute a fundamental frequency resonant tank. In detail, an impedance $Z_{in1}$ at a fundamental frequency fo may be illustrated as follows:

$$Z_{in1} @ fo = s\left(L_1 + \frac{L_2}{2}\left[\frac{1+s^2(L_3 2C_2)}{1+s^2\left(L_3 + \frac{L_2}{2}\right)(2C_2)}\right]\right) \Big\| \frac{1}{s(2C_1)} \approx s\left(L_1 + \frac{L_2}{2}\right) \Big\| \frac{1}{s(2C_1)}$$

Furthermore, at least the inductor $L_2$, the capacitor $C_2$, the inductors $L_{31}$ and $L_{32}$ constitute a second harmonic filter to block or weaken second harmonic signals of the LC oscillator 10. In detail, an impedance $Z_{in2}$ at a second harmonic frequency 2fo may be illustrated as follows:

$$Z_{in2} @ 2fo = s\left(L_3 + \frac{L_2}{2}\left[\frac{1+s^2(L_1 2C_1)}{1+s^2\left(L_1 + \frac{L_2}{2}\right)(2C_1)}\right]\right) \Big\| \frac{1}{s(2C_2)} \approx s\left(L_3 + \frac{L_2}{2}\right) \Big\| \frac{1}{s(2C_2)}$$

In some embodiments, the inductors $L_{31}$ and $L_{32}$ may be omitted, e.g. the second end of inductor $L_{11}$ and the second end of the inductor $L_{12}$ may be directly connected to the drain terminals of the P-type transistor MP and the N-type transistor MN, respectively. Under this condition, at least the inductor $L_2$ and the capacitor $C_2$ constitute a second harmonic filter to block or weaken the second harmonic signals. In detail, the impedance $Z_{in2}$ under the condition where the inductors $L_{31}$ and $L_{32}$ are omitted may be illustrated as follows:

$$Z_{in2} @ 2fo = s\left(\frac{L_2}{2}\left[\frac{1+s^2(L_1 2C_1)}{1+s^2\left(L_1 + \frac{L_2}{2}\right)(2C_1)}\right]\right) \Big\| \frac{1}{s(2C_2)*\alpha} \approx s\left(\frac{L_2}{2}\right) \Big\| \frac{1}{s(2C_2*\alpha)}$$

As the inductors $L_{31}/L_{32}$ do not greatly affect the impedance $Z_{in1}$, related details are omitted here for brevity. The symbol α may represent a positive value, showing a larger $C_2$ multiplied by a factor for given 2fo, which is for illustrative purpose only, and is not meant to be a limitation of the present invention.

In general, a voltage gain $A_V$ from $V_2$ to $V_1$ is preferably as high as possible, where the voltage gain $A_V$ may be illustrated as follows:

$$A_V @ fo = \frac{V_1}{V_2} = 1 + \frac{L_1}{\frac{L_2}{2}\left[\frac{1+s^2(L_3 2C_2)}{1+s^2\left(L_3+\frac{L_2}{2}\right)(2C_2)}\right]} \approx 1 + \frac{L_1}{L_2}$$

The main purpose of the inductors $L_{31}$ and $L_{32}$ is to remove inevitable correlation between controlling the impedance $Z_{in2}$ and controlling the voltage gain $A_V$. For example, the impedance $Z_{in2}$ is desired to be as high as possible (more particularly, a peak resistance Rp of the impedance $Z_{in2}$ is desired to be as high as possible) in order to block or weaken the second harmonic frequency 2fo. Without the inductors $L_{31}$ and $L_{32}$, the peak resistance Rp may be illustrated as follows $$Rp = \frac{Q_L Q_C}{Q_L + Q_C}\sqrt{\frac{L_2}{C_2}}$$

Assume that $Q_L=Q_C$, where $Q_L$ represents a quality factor of the inductor $L_2$, and $Q_C$ represents a quality factor of the capacitor $C_2$. To increase $Z_{in}$ (more particularly, to increase Rp) without changing a resonant frequency (e.g. 2fo) of the second harmonic filter, $L_2$ needs to be increased and $C_2$ needs to be reduced. Meanwhile, the voltage gain Av will be decreasingly reached to unit. With the inductors $L_{31}$ and $L_{32}$, it is preferably to increase $L_3$ rather than increase $L_2$, in order to increase the impedance $Z_{in2}$ without sacrificing the voltage gain $A_V$, and thereby optimizing overall performance of the LC oscillator 10.

Figure 1B:
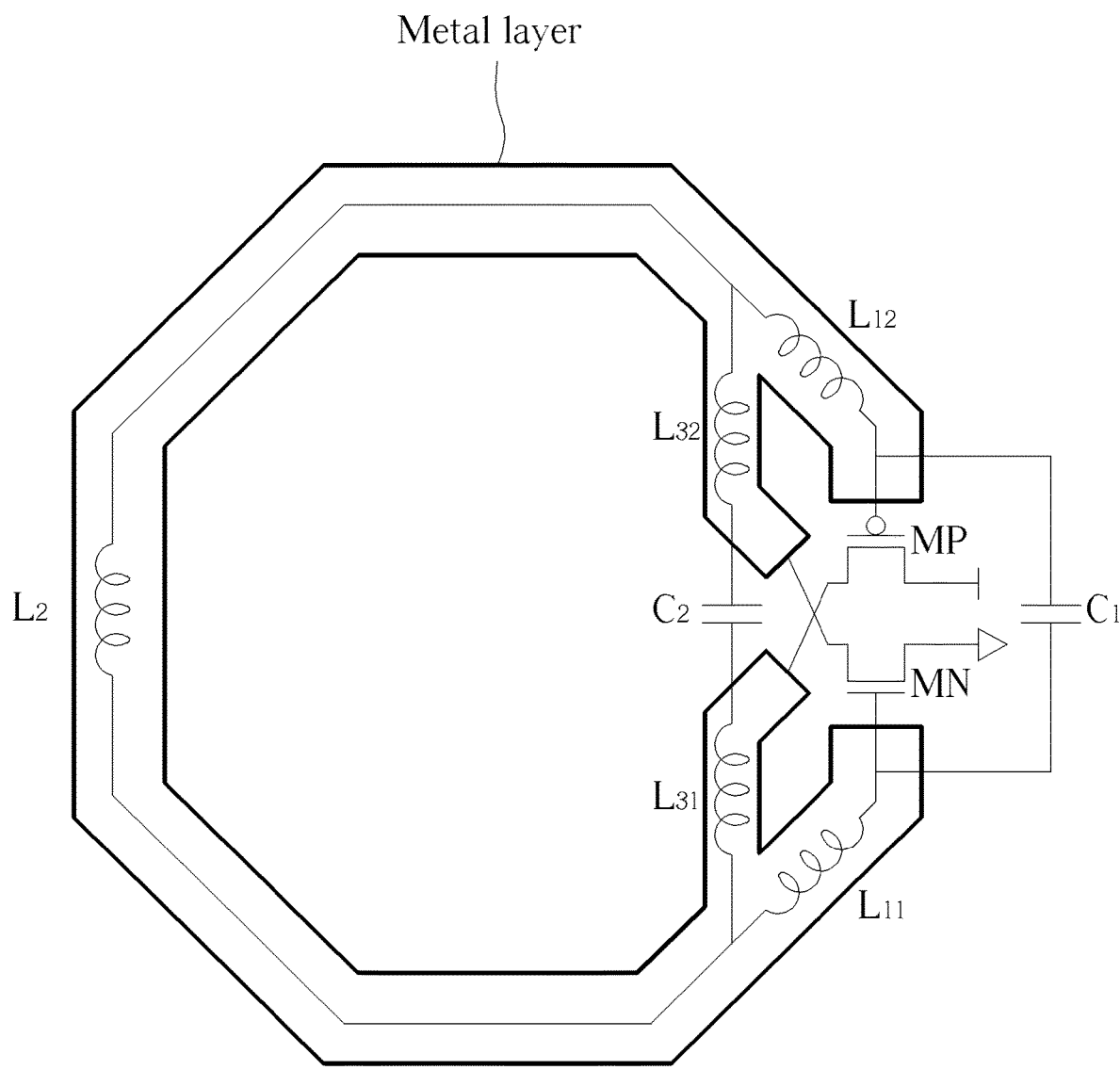
FIG. 1B shows layout of inductors within the LC oscillator shown in FIG. 1A according to an embodiment of the present invention.

In comparison with the related art, the LC oscillator 10 shown in FIG. 1A can effectively increase the impedance $Z_{in2}$ at the second harmonic frequency 2fo, and therefore improve the noise-related performance (e.g. less phase noise) and efficiency (e.g. figure of merit (FOM), which is related to power consumption, noise and signal swing). Another advantage of the LC oscillator 10 shown in FIG. 1A is that the second harmonic filter tracks variation caused by the fundamental frequency resonant tank. For example, when the capacitance $C_1$ varies and the resonant frequency of the fundamental frequency resonant tank is accordingly reduced (e.g. fo is reduced), the resonant frequency of the second harmonic filter will be reduced as well, substantially tracking the second harmonic frequency (e.g. tracking 2f0). In addition, as both the fundamental frequency resonant tank and the second harmonic filter will not be separated by transistors (e.g. the P-type transistor MP and the N-type transistors MN), all of the inductors $L_{11}$, $L_{12}$, $L_2$, $L_{31}$ and $L_{32}$ can be laid out together, and more particularly, as shown in FIG. 1B, the inductors $L_{11}$, $L_{12}$, $L_2$, $L_{31}$ and $L_{32}$ can be implemented by a continuous metal layer without segmentation. Even if the inductors $L_{31}$ and $L_{32}$ are omitted in some embodiments, the inductors $L_{11}$, $L_{12}$ and $L_2$ also have the similar advantage of being implemented by a continuous metal layer without segmentation. Under this condition, impacts of process variation upon these components can be quite similar or substantially identical to each other, and mismatch (e.g. relative difference) between these components due to process variation can be minimized, which can minimize performance sensitivity to the process variation.

Figure 2:
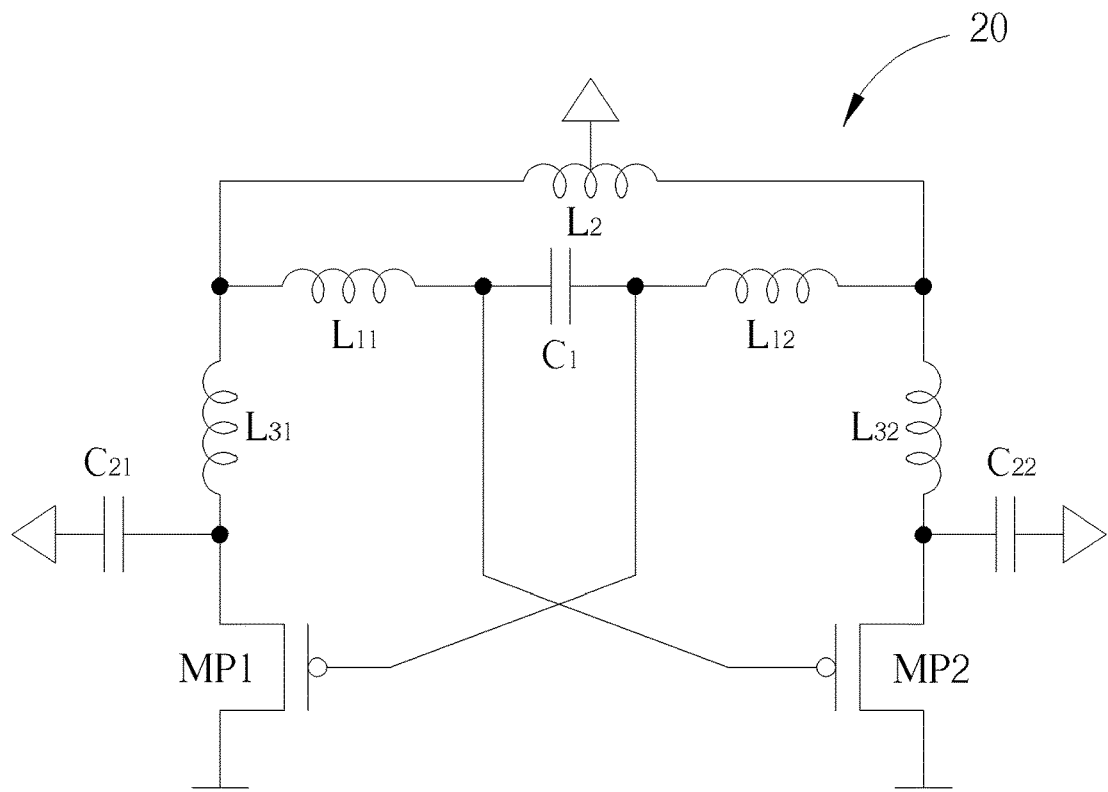
FIG. 2 is a diagram illustrating an LC oscillator according to an embodiment of the present invention.

It should be noted that the first transistor and the second transistor are not limited to utilizing different types of transistor. FIG. 2 is a diagram illustrating an LC oscillator 20 according to an embodiment of the present invention. The LC oscillator 20 is quite similar to the LC oscillator 10 shown in FIG. 1A. The main difference is both of the first transistor and the second transistor are implemented by P-type transistors MP1 and MP2, the at least one capacitor is implemented by capacitors $C_{21}$ and $C_{22}$, where the source terminal of the P-type transistors MP1 and MP2 are coupled to the supply voltage terminal, the capacitor $C_{21}$ is coupled between a drain terminal of the P-type transistor MP1 and the ground voltage terminal, the capacitor $C_{22}$ is coupled between a drain terminal of the P-type transistor MP2 and the ground voltage terminal, and a center tap of the inductor $L_2$ is coupled to the ground voltage terminal. The advantages and performance of the LC oscillator 20 are similar to that of the LC oscillator 10, and related details are not repeated here for brevity.

Figure 3:
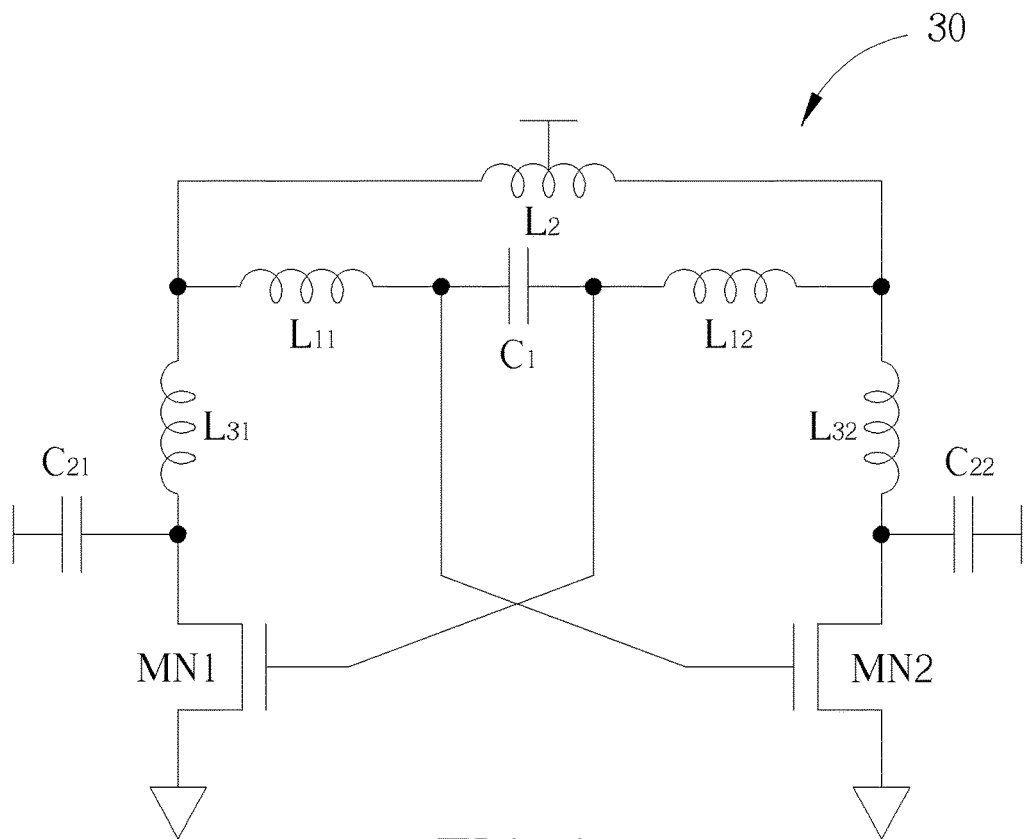
FIG. 3 is a diagram illustrating an LC oscillator according to an embodiment of the present invention.

FIG. 3 is a diagram illustrating an LC oscillator 30 according to an embodiment of the present invention. The LC oscillator 30 is quite similar to the LC oscillator 20 shown in FIG. 2. The main difference is both of the first transistor and the second transistor are implemented by N-type transistors MN1 and MN2, where the source terminal of the N-type transistors MN1 and MN2 are coupled to the ground voltage terminal, the capacitor $C_{21}$ is coupled between a drain terminal of the N-type transistor MN1 and the supply voltage terminal, the capacitor $C_{22}$ is coupled between a drain terminal of the N-type transistor MN2 and the supply voltage terminal, and the center tap of the inductor $L_2$ is coupled to the supply voltage terminal. The advantages and performance of the LC oscillator 30 are similar to that of the LC oscillator 10, and related details are not repeated here for brevity.

Figure 4:
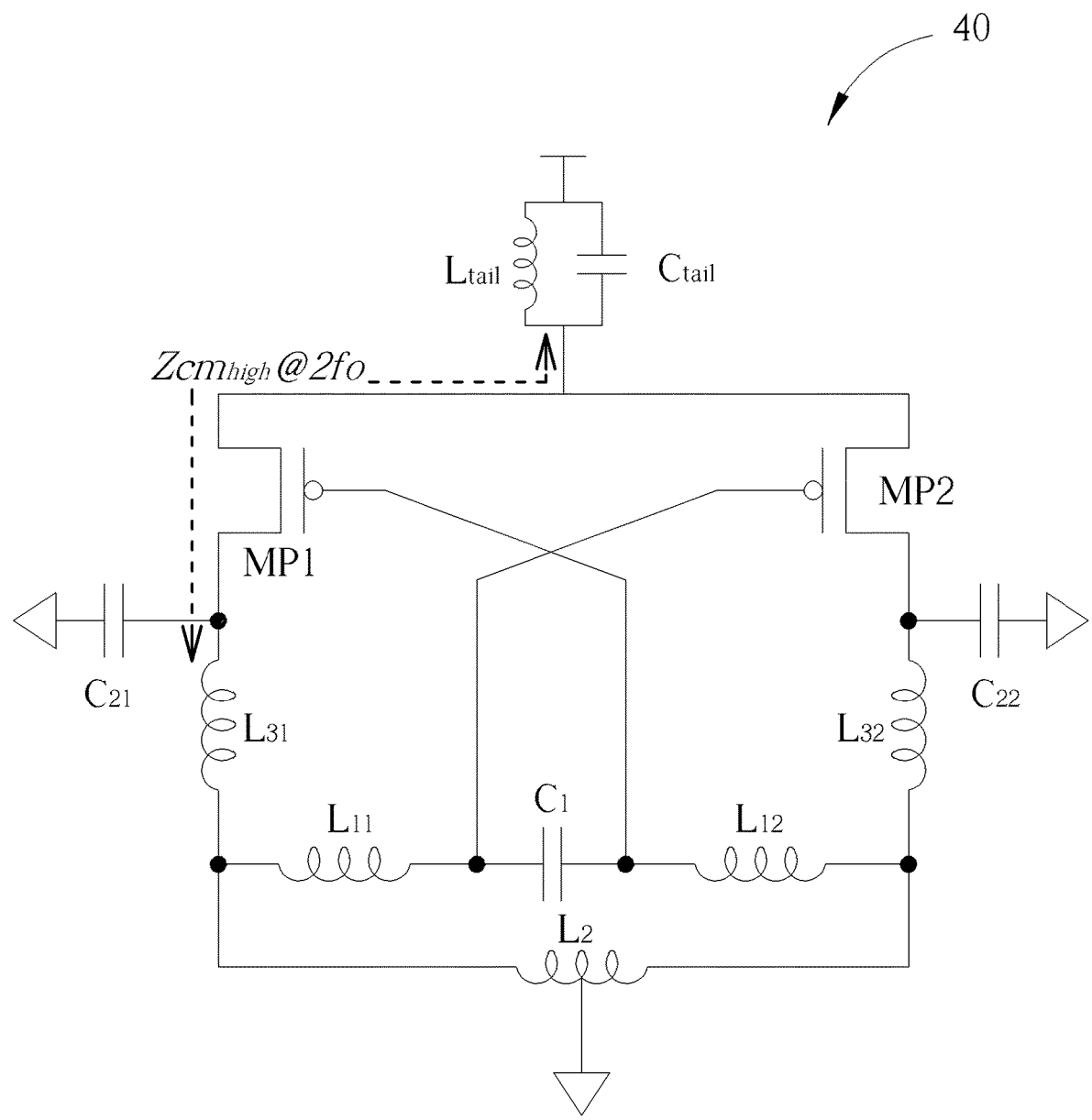
FIG. 4 is a diagram illustrating an LC oscillator according to an embodiment of the present invention.
Figure 5:
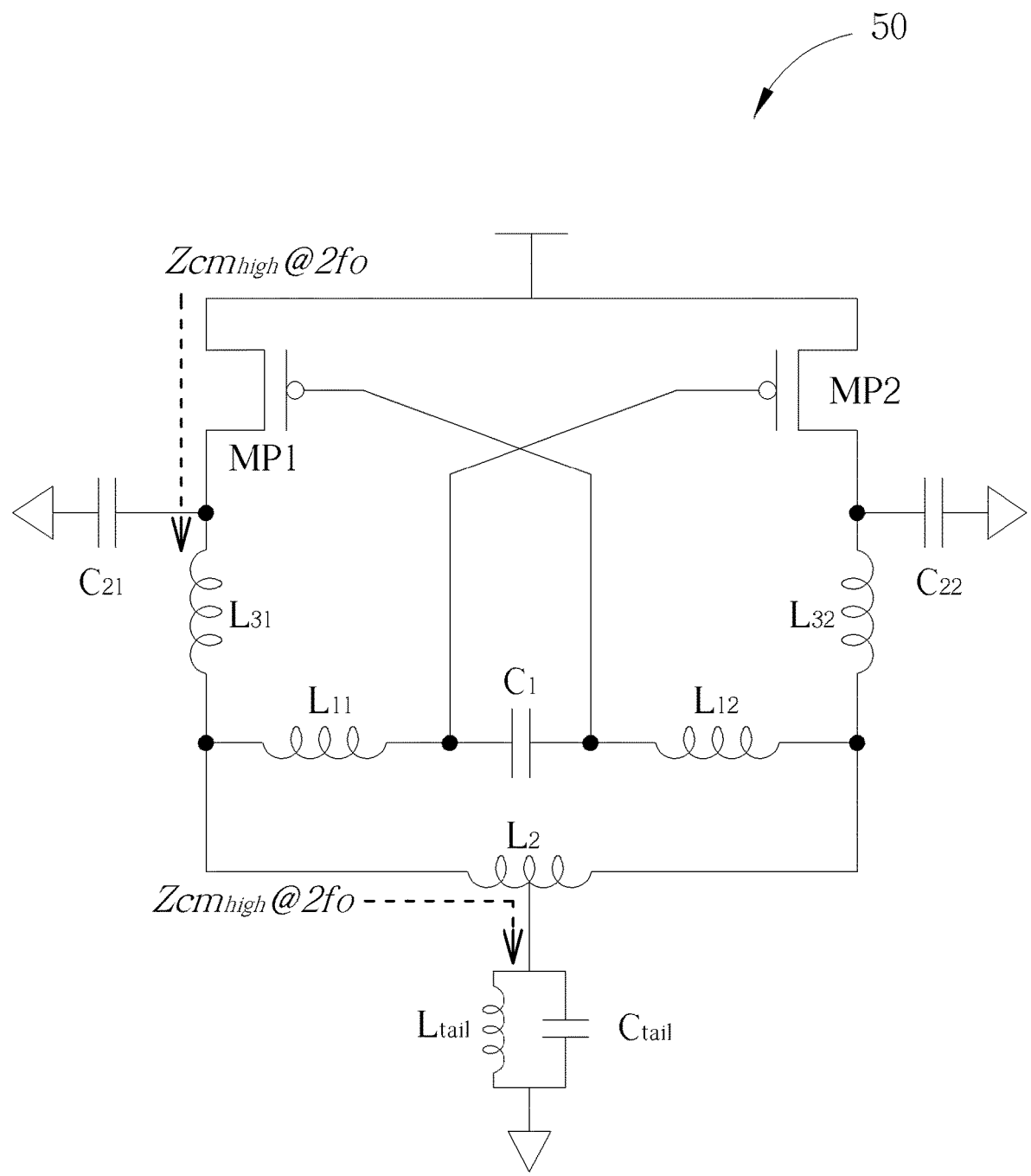
FIG. 5 is a diagram illustrating an LC oscillator according to an embodiment of the present invention.

As the second harmonic filtering is aimed to filter common mode current, any additional filter can be further added on a path where the common mode current flows through, in order to build double second harmonic filtering. More specifically, a tail filter can be added on a path where common mode current flow through in the LC oscillator 20 shown in FIG. 2 or the LC oscillator 30 shown in FIG. 3. Taking the LC oscillator 20 as an example, the tail filter (e.g. an inductor $L_{tail}$ and a capacitor $C_{tail}$ connected in parallel) can be coupled to source terminals of the P-type transistors MP1 and MP2, to configure an LC oscillator 40 as shown in FIG. 4, and an impedance $Zcm_{high}$ at the second harmonic frequency 2fo on a common mode signal path of the LC oscillator 40 are labeled "$Zcm_{high}@2fo$" in FIG. 4 for brevity. Similarly, the tail filter (e.g. the inductor $L_{tail}$ and the capacitor $C_{tail}$ connected in parallel) can be coupled to a center tap of the inductor $L_2$, to configure an LC oscillator 50 as shown in FIG. 5, and the impedance $Zcm_{high}$ at the second harmonic frequency 2fo on a common mode signal path of the LC oscillator 50 are labeled "$Zcm_{high}@2fo$" in FIG. 5 for brevity. In comparison with merely utilizing the tail filter, phase noise sensitivity of the LC oscillator 40 or 50 regarding capacitor variation can be greatly reduced. The configuration of adding the tail filter into the oscillator 30 may be deduced by analogy, and is therefore omitted here for brevity.

Figure 6A:
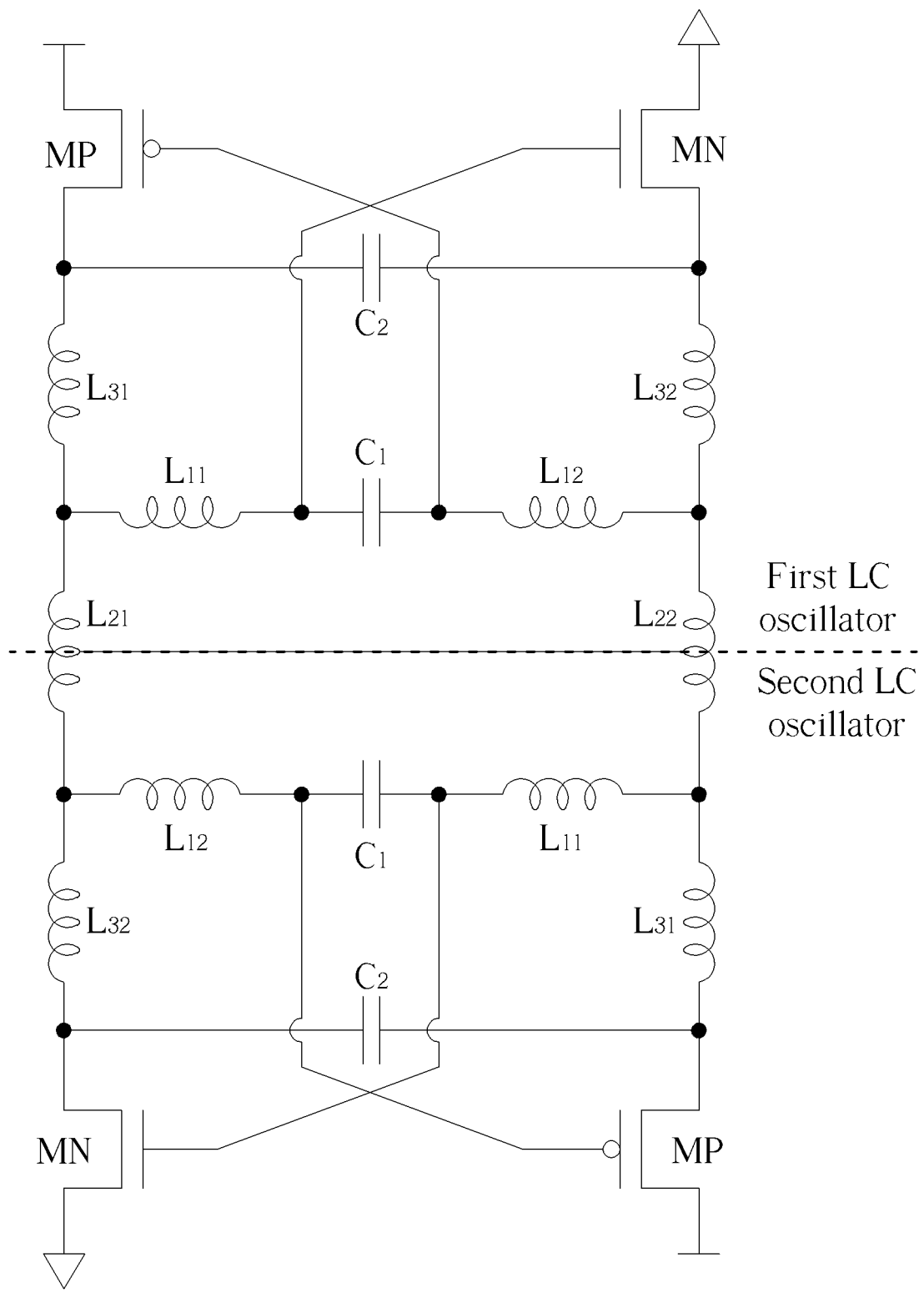
FIG. 6A is a diagram illustrating a dual core oscillator according to an embodiment of the present invention.

FIG. 6A is a diagram illustrating a dual core oscillator 60 according to an embodiment of the present invention. In particular, the dual core oscillator may comprise a first LC oscillator and a second LC oscillator identical to each other. For example, an upper half portion of the dual core oscillator 60 may be regarded as the first LC oscillator, and a lower half portion of the dual core oscillator 60 may be regarded as the second LC oscillator, where each of the first LC oscillator and the second LC oscillator may be implemented by the LC oscillator 10 shown in FIG. 1A, and the part-two inductor of the first LC oscillator is coupled to the part-two inductor of the second LC oscillator. It should be noted that the part-two inductor of the first LC oscillator and the part-two inductor of the second LC oscillator are implemented by inductors $L_{21}$ and $L_{22}$, where a center tap of the inductor $L_{21}$ is coupled to a center tap of the inductor $L_{22}$, and both of the inductors $L_{21}$ and $L_{22}$ have the inductance $L_2$. More particularly, combination of an upper portion of the inductor $L_{21}$ and an upper portion of the inductor $L_{22}$ may be regarded as the part-two inductor of the first LC oscillator, and combination of a lower portion of the inductor $L_{21}$ and a lower portion of the inductor $L_{22}$ may be regarded as the part-two inductor of the second LC oscillator. Furthermore, all inductors (e.g. the inductor $L_{11}/L_{12}$ and the inductors $L_{31}/L_{32}$ within both of the first LC oscillator and the second LC oscillator, and the inductors $L_{21}/L_{22}$) can be implemented by a continuous metal layer without segmentation as shown in FIG. 6B.

In some embodiments, alternative designs of the LC oscillator 10 may be applied to the dual core oscillator 60, e.g. the inductors $L_{31}$ and $L_{32}$ within the first LC oscillator and the second LC oscillator of the dual core oscillator 60 may be omitted. Similarly, when the inductors $L_{31}$ and $L_{32}$ within the first LC oscillator and the second LC oscillator may be omitted, all inductors (e.g. the inductor $L_{11}/L_{12}$ within both of the first LC oscillator and the second LC oscillator, and the inductors $L_{21}/L_{22}$) within the dual core oscillator 60 can also be implemented by a continuous metal layer without segmentation. Design considerations of the dual core oscillator 60 with/without the inductors $L_{31}$ and $L_{32}$ may refer to the description related to the embodiment of FIG. 1A, and are not repeated here for brevity.

Figure 6B:
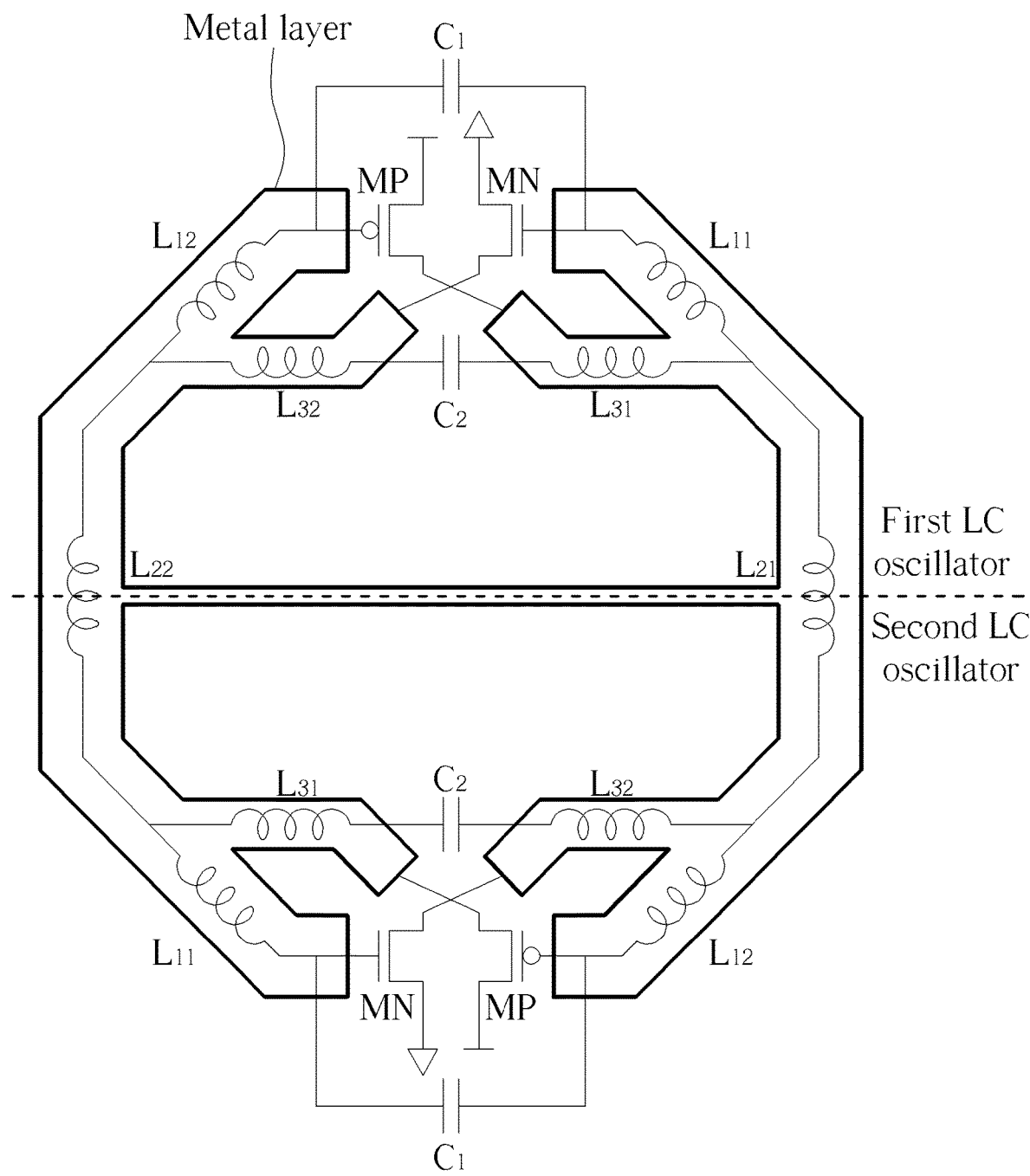
FIG. 6B shows layout of inductors within the dual core oscillator shown in FIG. 6A according to an embodiment of the present invention.
Figure 7A:
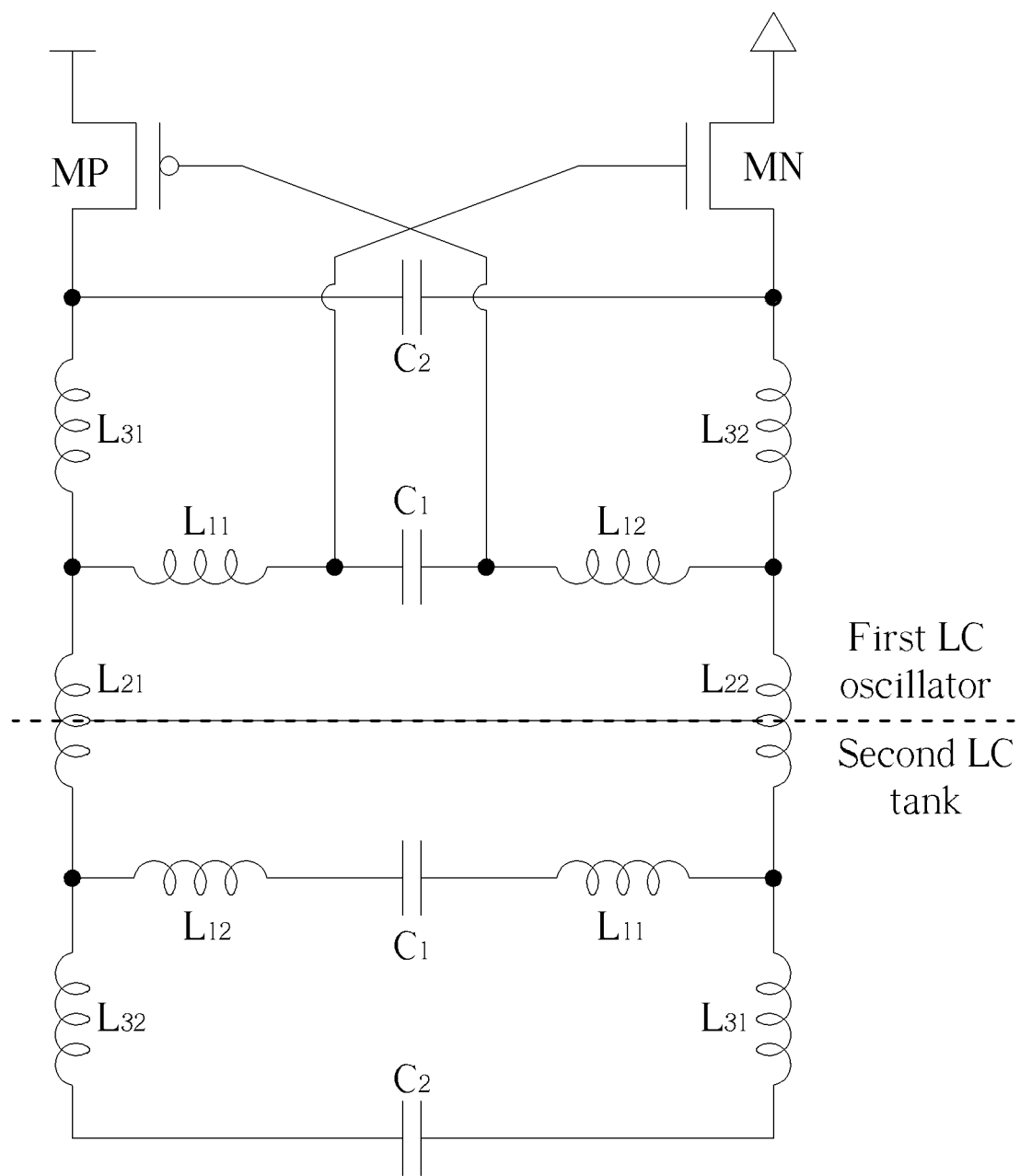
FIG. 7A is a diagram illustrating a dual core oscillator according to another embodiment of the present invention.
Figure 7B:
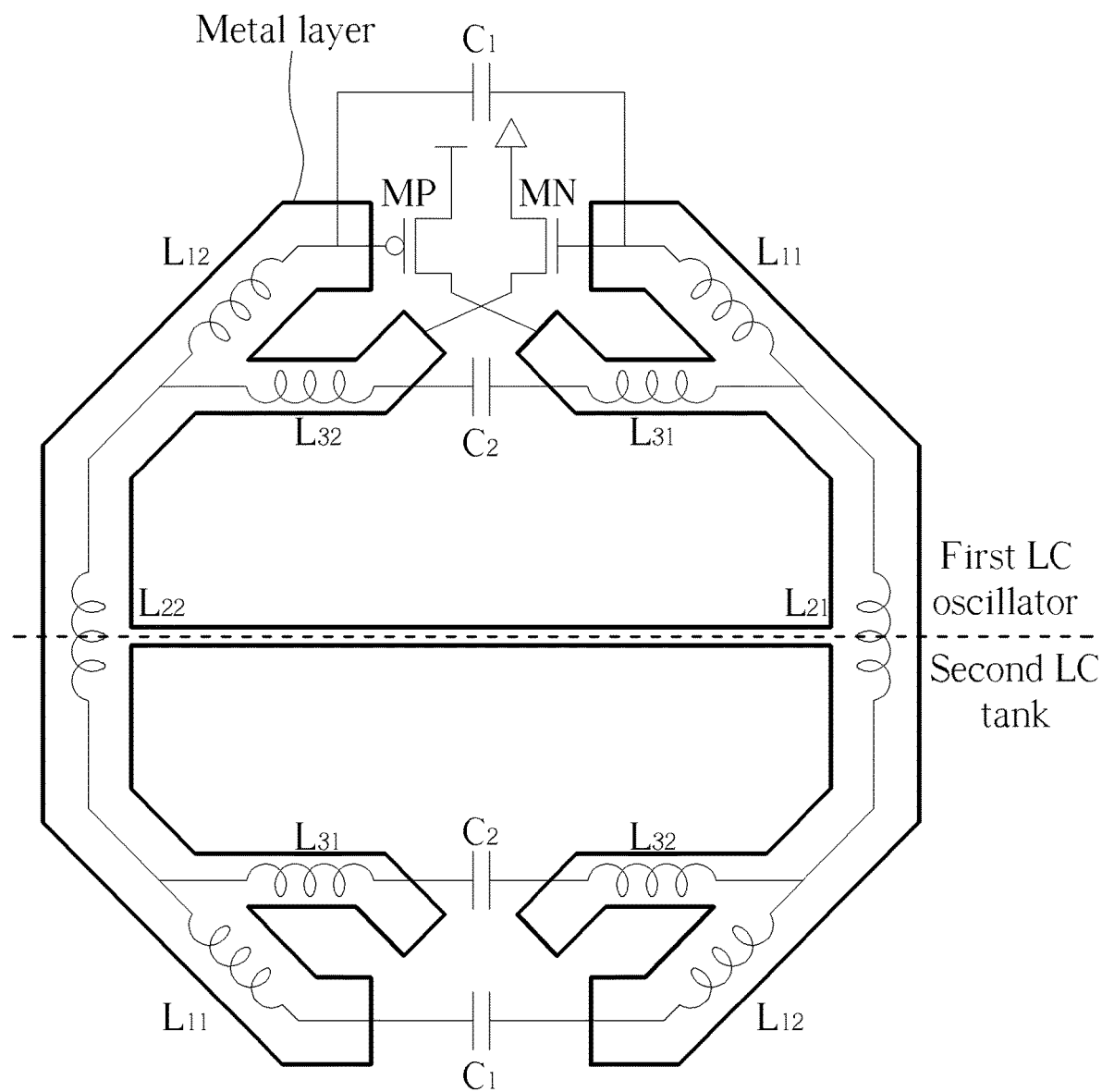
FIG. 7B shows layout of inductors within the dual core oscillator shown in FIG. 7A according to another embodiment of the present invention.

In some embodiments, the P-type transistor MP and the N-type transistor MN within the second LC oscillator shown in FIGS. 6A and 6B may be omitted. For example, the second LC oscillator can be replaced with a second LC tank (e.g. without transistor therein), as shown by the lower half portion of a dual core oscillator 70 shown in FIG. 7A. As the only difference between the dual core oscillator 60 and the dual core oscillator 70 is whether to configure the P-type transistor MP and the N-type transistor MN in the second LC oscillator, other details of the dual core oscillator 70 are not repeated here for brevity. Similarly, all inductors (e.g. the inductor $L_{11}/L_{12}$ and the inductors $L_{31}/L_{32}$ within both of the first LC oscillator and the second LC tank, and the inductors $L_{21}/L_{22}$) can be implemented by a continuous metal layer without segmentation as shown in FIG. 7B.

As the dual core oscillators 60 and 70 are based on the architecture shown in FIG. 1A, the dual core oscillators 60 and 70 also have all the advantages of the LC oscillator 10. Furthermore, in comparison with utilizing a single LC oscillator (e.g. any of the LC oscillators 10, 20, 30, 40 and 50), the dual core oscillators 60 and 70 may effectively double output signal swing/power, and thereby equivalently reduce overall phase noise (e.g. improve 3 dB) under a condition where the efficiency (e.g. FOM) is unchanged.

Briefly summarized, the embodiments of the present invention provides an LC oscillator with an embedded second harmonic filter, which combines a fundamental resonant tank and a second harmonic filter into one LC network. The LC oscillator can effectively increase the impedance regarding second harmonic signals without sacrificing the voltage gain, and impact of process variation upon overall performance can be minimized, since capacitors and inductors mismatch can be minimized by properly layout as shown in the embodiments. In comparison with the related art, the embodiments of the present invention will not greatly increase overall cost. Thus, the present invention can improve overall performance of the LC oscillator without introducing any side effect or in a way that is less likely to introduce side effects.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An inductor-capacitor (LC) oscillator with an embedded second harmonic filter, comprising:
   a first transistor and a second transistor;
   a first part-one inductor and a second part-one inductor, wherein a first end of the first part-one inductor and a first end of the second part-one inductor are coupled to gate terminals of the second transistor and the first transistor, respectively;
   a part-one capacitor, coupled between the first end of the first part-one inductor and the first end of the second part-one inductor;
   a part-two inductor, coupled between a second end of the first part-one inductor and a second end of the second part-one inductor; and
   at least one part-two capacitor, coupled to drain terminals of the first transistor and the second transistor;
   wherein at least the part-two inductor and the at least one part-two capacitor constitute a second harmonic filter to block or weaken second harmonic signals.

2. The LC oscillator of claim 1, wherein at least the first part-one inductor, the second part-one inductor, the part-two inductor and the part-one capacitor constitute a fundamental frequency resonant tank.

3. An inductor-capacitor (LC) oscillator with an embedded second harmonic filter, comprising:
   a first transistor and a second transistor;
   a first part-one inductor and a second part-one inductor, wherein a first end of the first part-one inductor and a first end of the second part-one inductor are coupled to gate terminals of the second transistor and the first transistor, respectively;
   a part-one capacitor, coupled between the first end of the first part-one inductor and the first end of the second part-one inductor;
   a part-two inductor, coupled between a second end of the first part-one inductor and a second end of the second part-one inductor; and
   at least one part-two capacitor, coupled to drain terminals of the first transistor and the second transistor;
   wherein the first part-one inductor, the second part-one inductor and the part-two inductor are implemented by a continuous metal layer without segmentation.

4. An inductor-capacitor (LC) oscillator with an embedded second harmonic filter, comprising:
   a first transistor and a second transistor;
   a first part-one inductor and a second part-one inductor, wherein a first end of the first part-one inductor and a first end of the second part-one inductor are coupled to gate terminals of the second transistor and the first transistor, respectively;
   a part-one capacitor, coupled between the first end of the first part-one inductor and the first end of the second part-one inductor;
   a part-two inductor, coupled between a second end of the first part-one inductor and a second end of the second part-one inductor;

at least one part-two capacitor, coupled to drain terminals of the first transistor and the second transistor; and a first part-three inductor and a second part-three inductor, wherein the first part-three inductor is coupled between the second end of the first part-one inductor and the drain terminal of the first transistor, and the second part-three inductor is coupled between the second end of the second part-one inductor and the drain terminal of the second transistor.

5. The LC oscillator of claim 4, wherein at least the part-two inductor, the at least one part-two capacitor, the first part-three inductor and the second part-three inductor constitute a second harmonic filter to block or weaken second harmonic signals of the LC oscillator.

6. The LC oscillator of claim 4, wherein the first part-one inductor, the second part-one inductor, the part-two inductor, the first part-three inductor and the second part-three inductor are implemented by a continuous metal layer without segmentation.

7. An inductor-capacitor (LC) oscillator with an embedded second harmonic filter, comprising:
a first transistor and a second transistor;
a first part-one inductor and a second part-one inductor, wherein a first end of the first part-one inductor and a first end of the second part-one inductor are coupled to gate terminals of the second transistor and the first transistor, respectively;
a part-one capacitor, coupled between the first end of the first part-one inductor and the first end of the second part-one inductor;
a part-two inductor, coupled between a second end of the first part-one inductor and a second end of the second part-one inductor; and
at least one part-two capacitor, coupled to drain terminals of the first transistor and the second transistor;
wherein the first transistor is a P-type transistor, the second transistor is an N-type transistor, and a first end and a second end of the at least one part-two capacitor are coupled to the drain terminals of the first transistor and the second transistor, respectively.

8. The LC oscillator of claim 1, wherein both of the first transistor and the second transistor are P-type transistors, or both of the first transistor and the second transistor are N-type transistors.

9. The LC oscillator of claim 1, further comprising a tail filter coupled to source terminals of the first transistor and the second transistor.

10. The LC oscillator of claim 1, further comprising a tail filter coupled to a center tap of the part-two inductor.

11. A dual core oscillator, comprising:
a first inductor-capacitor (LC) oscillator and a second LC oscillator identical to each other, wherein each of the first LC oscillator and the second LC oscillator comprises:
a first transistor and a second transistor;
a first part-one inductor and a second part-one inductor, wherein a first end of the first part-one inductor and a first end of the second part-one inductor are coupled to gate terminals of the second transistor and the first transistor, respectively;
a part-one capacitor, coupled between the first end of the first part-one inductor and the first end of the second part-one inductor;
a part-two inductor, coupled between a second end of the first part-one inductor and a second end of the second part-one inductor; and
at least one part-two capacitor, coupled to drain terminals of the first transistor and the second transistor;
wherein the part-two inductor of the first LC oscillator is coupled to the part-two inductor of the second LC oscillator.

12. The dual core oscillator of claim 11, wherein at least the first part-one inductor, the second part-one inductor, the part-two inductor and the part-one capacitor constitute a fundamental frequency resonant tank.

13. The dual core oscillator of claim 11, wherein at least the part-two inductor and the at least one part-two capacitor constitute a second harmonic filter to block or weaken second harmonic signals.

14. The dual core oscillator of claim 11, wherein the first part-one inductor, the second part-one inductor and the part-two inductor within the first LC oscillator and the first part-one inductor, the second part-one inductor and the part-two inductor within the second LC oscillator are implemented by a continuous metal layer without segmentation.

15. The dual core oscillator of claim 11, wherein each of the first LC oscillator and the second LC oscillator further comprises:
a first part-three inductor and a second part-three inductor, wherein the first part-three inductor is coupled between the second end of the first part-one inductor and the drain terminal of the first transistor, and the second part-three inductor is coupled between the second end of the second part-one inductor and the drain terminal of the second transistor.

16. The dual core oscillator of claim 15, wherein at least the part-two inductor, the at least one part-two capacitor, the first part-three inductor and the second part-three inductor constitute a second harmonic filter to block or weaken second harmonic signals of the LC oscillator.

17. The dual core oscillator of claim 15, wherein the first part-one inductor, the second part-one inductor, the part-two inductor, the first part-three inductor and the second part-three inductor within the first LC oscillator and the first part-one inductor, the second part-one inductor, the part-two inductor, the first part-three inductor and the second part-three inductor within the second LC oscillator are implemented by a continuous metal layer without segmentation.

18. The dual core oscillator of claim 11, wherein the first transistor is a P-type transistor, the second transistor is an N-type transistor, and a first end and a second end of the at least one part-two capacitor are coupled to the drain terminals of the first transistor and the second transistor, respectively.

19. A dual core oscillator, comprising:
an inductor-capacitor (LC) oscillator, comprising:
a first transistor and a second transistor; and
a first LC tank, comprising:
a first part-one inductor and a second part-one inductor, wherein a first end of the first part-one inductor and a first end of the second part-one inductor are coupled to gate terminals of the second transistor and the first transistor, respectively;
a part-one capacitor, coupled between the first end of the first part-one inductor and the first end of the second part-one inductor;
a part-two inductor, coupled between a second end of the first part-one inductor and a second end of the second part-one inductor; and
at least one part-two capacitor, coupled to drain terminals of the first transistor and the second transistor; and a second LC tank, comprising at least one inductor and at least one capacitor;

wherein the part-two inductor of the first LC oscillator is coupled to the at least one inductor of the second LC tank.

* * * * *